(12) United States Patent
Cheng et al.

(10) Patent No.: US 8,373,204 B2
(45) Date of Patent: Feb. 12, 2013

(54) SEMICONDUCTOR DEVICE AND METHOD OF MANUFACTURING THEREOF

(75) Inventors: Kai Cheng, Leuven (BE); Stefan Degroote, Scherpenheuvel-Zichem (BE)

(73) Assignee: IMEC, Leuven (BE)

( * ) Notice: Subject to any disclaimer, the term of this patent is extended or adjusted under 35 U.S.C. 154(b) by 137 days.

(21) Appl. No.: 12/916,346

(22) Filed: Oct. 29, 2010

(65) Prior Publication Data

US 2011/0101370 A1    May 5, 2011

Related U.S. Application Data

(60) Provisional application No. 61/260,268, filed on Nov. 11, 2009.

(30) Foreign Application Priority Data

Oct. 30, 2009   (EP) ..................................... 09174720

(51) Int. Cl.
    *H01L 27/148*    (2006.01)
(52) U.S. Cl. ........ 257/244; 257/262; 257/347; 257/353; 257/368; 257/522; 257/E29.287
(58) Field of Classification Search .................. 257/244, 257/262, 347, 353, 368, 522
    See application file for complete search history.

(56) References Cited

U.S. PATENT DOCUMENTS

| | | | |
|---|---|---|---|
| 6,265,289 B1 | 7/2001 | Zheleva et al. | |
| 7,247,889 B2 | 7/2007 | Hanson et al. | |
| 2006/0223211 A1* | 10/2006 | Mishra et al. | 438/41 |
| 2006/0284187 A1* | 12/2006 | Wierer et al. | 257/79 |
| 2008/0080581 A1* | 4/2008 | Wierer et al. | 372/46.01 |

FOREIGN PATENT DOCUMENTS

| | | |
|---|---|---|
| EP | 1 184 897 | 3/2002 |
| EP | 1 653 504 | 5/2006 |
| WO | WO 2009/005894 | 1/2009 |

OTHER PUBLICATIONS

Cheng et al., AlGaN-based heterostructure grown on 4 inch Si(111) by MOVPE, physica status solidi (c) vol. 5, No. 6, p. 1600-1602 (2008).

(Continued)

*Primary Examiner* — Wai Sing Louie
(74) *Attorney, Agent, or Firm* — Knobbe Martens Olson & Bear LLP

(57) ABSTRACT

A semiconductor device and method of manufacturing the device is disclosed. In one aspect, the device includes a semiconductor substrate and a GaN-type layer stack on top of the semiconductor substrate. The GaN-type layer stack has at least one buffer layer, a first active layer and a second active layer. Active device regions are definable at an interface of the first and second active layer. The semiconductor substrate is present on an insulating layer and is patterned to define trenches according to a predefined pattern, which includes at least one trench underlying the active device region. The trenches extend from the insulating layer into at least one buffer layer of the GaN-type layer stack and are overgrown within the at least one buffer layer, so as to obtain that the first and the second active layer are continuous at least within the active device regions.

16 Claims, 9 Drawing Sheets

OTHER PUBLICATIONS

Fieger et al., Growth and characterization of AlGaN/GaN HEMT on SiCOI substrates, physica status solidi (c), vol. 2, No. 7, p. 2607-2610 (2005).
Jia et al., AlGaN-GaN HEMTs on Patterned Silicon (111) Substrate, IEEE Electron Device Letters, vol. 26, No. 3, Mar. 2005, p. 130-132.
Karmalkar et al., Very high voltage AlGaN/GaN high electron mobility transistors using a field plate deposited on a stepped insulator, Solid-State Electronics, vol. 45, p. 1645-1652 (2001).
Shah et al., Fabrication of Freestanding GaN Micromechanical Structures on Silicon-on-Insulator Substrates, Electrochemical and Solid-State Letters, vol. 8, Issue 10, p. G275-G279 (2005).
European Search Report mailed on Apr. 26, 2010 in European Patent Application No. 09174720.4.

* cited by examiner

SEMICONDUCTOR DEVICE AND METHOD OF MANUFACTURING THEREOF

CROSS REFERENCE TO RELATED APPLICATIONS

This application claims priority under 35 U.S.C. §119(e) to U.S. provisional patent application 61/260,268 filed on Nov. 11, 2009, which application is hereby incorporated by reference in its entirety.

BACKGROUND OF THE INVENTION

1. Field of the Invention

The invention relates to a semiconductor substrate structure comprising a GaN-type layer stack of at least one buffer layer, a first active layer and a second active layer on top of a semiconductor substrate.

The invention also relates to a method of manufacturing such a semiconductor substrate structure and to devices made in such a semiconductor substrate structure.

2. Description of the Related Technology

GaN is a promising candidate for use for power and RF applications as well as for optical applications. Examples hereof include the manufacture of light emitting diodes, power amplifiers, power converters. Typical examples of GaN devices are a InGaN/GaN light emitting diode and an AlGaN/GaN HEMT device, i.e. a transistor including a source, a drain, a gate and a channel.

Typically, a silicon substrate is used as a carrier and growth template of the GaN layers. Good results have been achieved with substrates with a top layer of SiC in a (001) orientation and Si of a (111) orientation. Such Si (111) semiconductor substrate is advantageously provided as part of an SOI-type structure further comprising a handling wafer and a buried insulating layer. A GaN-type layer stack comprising a buffer layer, a first and a second active layer is grown thereon. Typically the GaN-type layer stack includes a nucleation layer. The layers in the stack typically contain nitrides of gallium (Ga), aluminum (Al), indium (In) and combinations thereof, e.g. AlGaN, InAlN, InGaN. The relative content of Ga and Al may vary across the layers. Other elements may be present as well or alternatively, such as known to a person skilled in the art. The layer stack may be grown as a continuous layer or as a discontinuous layer.

One of the problems of the use of a Si layer as a template for GaN-type layer stacks is the reliability. Particularly due to the difference in thermal expansion between silicon and gallium nitride, formation of cracks as well as relatively high defect densities have been found. Reliability tends to be an issue due to such cracks and defects particularly in the heavier use conditions for which the GaN-type stacks are most suitable. In order to reduce the mismatch problem, it is known to pattern the top layer of the substrate and/or the buffer layer in the GaN-type stack. The subsequent growth of the active layers then effectively occurs on localized islands.

U.S. Pat. No. 6,265,289 discloses such a method of localized growth of GaN, so as to reduce the defect density. The method starts with the provision of a layer stack of an AlN buffer and a GaN layer on top of a SiC substrate. Trenches are provided in this layer stack, the remaining portions of the layer stack being posts. These trenches may extend into the buffer layer or into the top layer of SiC. Subsequently, GaN is grown laterally from the posts into the trenches. This results in coalescence of the lateral growth fronts to obtain a continuous layer. At the bottom of the trench, a void may remain. Material simultaneously formed by vertical overgrowth of the posts is thereafter removed and replaced by GaN formed in a second lateral growth process. This method is however disadvantageous, for instance from a manufacturing perspective, due to the substantial growth time.

IEEE Electron Device Letters, 26 (2005), 130-132 discloses such a method of localized growth of GaN. This prior art method starts with the formation of a rectangular ridge in the Si(111) substrate, e.g. by removing the top layer around the ridge. A GaN-type layer stack is formed on the ridge. It is reported that the layer stack on the ridge is formed crack-free with a GaN buffer layer as thick as 1.5 µm. A polyimide based planarization technique is used for connecting the active device to pads of probing electrodes. In this technique a trench around the ridge is filled with polyimide. A conductor may be defined thereon. However, such polyimide technique is not a standard technology in semiconductor processing. Moreover, the polyimide may not be resistant to the rather stringent use conditions for GaN devices, in which particularly a lot of heat may be generated.

Although the methods of localized growth of GaN-type stacks reduce cracks and defect density, the resulting device appear insufficient for use in a power converter, such as a DC-DC converters, an AC-DC converters or other high voltage high efficiency switching devices. Particularly, the breakdown voltage appears insufficient. Typical breakdown requirements thereof include a breakdown voltage of 600V or 1000V in combination with a leakage of less than 1 µA/mm at 80% of the breakdown voltage. The breakdown voltage is therein specified as the voltage at which the leakage current is 1 mA/mm.

There is therefore a need for an improved substrate structure in which also power devices meeting such harsh requirements can be defined. Such substrate structure may as well be very suitable for other markets in which GaN is an interesting candidate.

It is therefore desirable to provide an alternative substrate structure and an alternative manufacturing method thereof suitable for higher breakdown voltages.

It is also desirable to provide an improved semiconductor device and an improved manufacturing method thereof.

SUMMARY OF CERTAIN INVENTIVE ASPECTS

According to a first aspect of the invention, a semiconductor device structure is provided. The semiconductor substrate structure comprises a semiconductor substrate and a GaN-type layer stack on top of a semiconductor substrate, which GaN-type layer stack comprises at least one buffer layer, a first active layer and a second active layer, at an interface of which first and second active layer active device regions are definable. The semiconductor substrate is present on an insulating layer and is patterned to define trenches according to a predefined pattern, which pattern comprises at least one trench underlying such active device region. The trenches extend from the insulating layer into at least one buffer layer of the GaN-type layer stack and being overgrown within the at least one buffer layer, so as to obtain that the first and the second active layer are continuous at least within the active device regions.

According to a second aspect of the invention, a method of manufacturing such a semiconductor substrate structure is provided. The method comprises a) providing a patterned semiconductor substrate on top of an insulating layer, which patterned semiconductor substrate comprises trenches according to a predefined pattern, which pattern of trenches comprises at least one trench underlying such active device region, b) depositing the at least one buffer layer such that the trenches in the patterned semiconductor substrate are overgrown, and c) depositing the first and the second active layer such that these are continuous at least within the active device regions.

According to a third aspect of the invention, a method of manufacturing a semiconductor device is provided, the method comprising a) providing the semiconductor substrate structure according to the invention, b) defining the source and a drain electrode so that the active device region is in between of them to act as a channel, and c) defining the gate electrode for influencing a charge carrier distribution within the channel.

According to a fourth aspect of the invention, a semiconductor device comprising a semiconductor substrate and a GaN-type layer stack on top of a semiconductor substrate is provided. The semiconductor substrate is present on an insulating layer. The GaN-type layer stack comprises at least one buffer layer, a first active layer and a second active layer, at an interface of which first and second active layer an active device region is defined. The active device region acts as a channel between a source and a drain electrode, and a gate electrode is present for influencing a charge carrier distribution in the active device region. The semiconductor substrate is patterned to define trenches according to a predefined pattern, which pattern comprises at least one trench underlying such active device region. The trenches extend from the buried insulating layer into at least one buffer layer of the GaN-type layer stack and are overgrown within the at least one buffer layer, so as to obtain that the first and the second active layer are continuous at least within the active device regions.

It was observed by the inventors in research leading to certain inventive aspects that semiconductor devices defined in the GaN-type layer stack have a saturated breakdown voltage, even if a distance between the source and the drain region was large. The inventors subsequently understood that this saturated behavior of the breakdown does not result from a breakdown in the AlGaN of GaN layers, but from breakdown in the underlying semiconductor substrate. This breakdown appears to be due to a parasitic conductive channel through the semiconductor substrate. Following contributing factors are mentioned. First, the underlying semiconductor substrate is relatively conductive in comparison to the layer stack. The ratio between the resistivity of the layers in the layer stack and the semiconductor substrate may be above about 50 and typically is about 100 or more. Second, Al and Ga atoms may diffuse into the semiconductor substrate during high temperature steps such as annealing and growth. These atoms are then dopant atoms enabling charge transport, and hence generate a conductive path.

By defining trenches within the semiconductor substrate, the effective length of such parasitic path is strongly increased; the parasitic path needs to pass an underlying insulating layer, i.e. typically a buried insulating layer. As a result, the path becomes so long that it looses its parasitic effect.

It is an advantage of one inventive aspect that the provision of the trenches leads to a very regular, effectively monocrystalline growth of the GaN-type layer stack. That is highly beneficial for the device properties in the active device region. Suitably, the trenches are defined so as to underlie the active device region only and are absent elsewhere. This has the benefit that the heat transfer from the device to the underlying substrate is not affected significantly. The heat transfer inside the semiconductor substrate may further be improved in that the insulating layer has a smaller thickness or is completely absent outside the active device regions.

It is known from U.S. Pat. No. 7,247,889 that a parasitic channel may be present in the silicon (111) substrate underlying a GaN-type layer stack, in case that a high frequency transistor is defined in the GaN-type layer stack. An intermediate layer of silicon nitride is present between the semiconductor substrate and the GaN-type layer stack to reduce the parasitic channel. This is done by nitridation of the silicon substrate and results in an amorphous layer. Therewith the peak free carrier concentration in the parasitic channel is reduced with about 2 orders of magnitude to about $10^{16}/cm^3$. However, it is not clear how to meet the requirements for power converters.

In a preferred embodiment, the at least one buffer layer comprises a first sublayer and a second sublayer. It has a ternary or more complex composition containing gallium, nitride and a further group-III element. Typically this is AlGaN. The second sublayer having a Ga-content that is higher than the Ga-content of the first sublayer. The trench is overgrown in the second sublayer. By overgrowing the trench in a layer with a relatively high Ga-content, the second sublayer is a good template for the subsequent growth of the active layers. Suitably, the second sublayer is Ga-rich, i.e. the material includes more than about 50 at % of Ga in comparison with the further group-III element, suitably Al. Preferably the material includes more than about 70 at % of Ga, for instance about 75-85 at %.

In a further preferred embodiment, the at least one buffer layer has a surface with the trench, which surface includes an angle relative to a top surface of the top layer of the semiconductor substrate, which angle is smaller than about 45 degrees, preferably between about 10 and 40 degrees. Keeping the angle small results in a relatively quick overgrowth. This tends to allow some flexibility in the crystal growth of the buffer layer. Such flexibility is desired in order to match and attach the crystals overgrowing the trench from different sides.

Suitably, the pattern of trenches is designed such that the at least one trench underlying the active device region is substantially aligned with the gate electrode. The trench is therein located between the gate electrode and the drain electrode, when viewed in a perpendicular projection of electrodes and trenches onto the substrate. In this manner it is most effective to increase the length of the parasitic conductive path. The area between gate and drain turns out most sensitive to breakdown and parasitic channels, particularly in a design of the source and drain electrode as an interdigitated pair.

Advantageously, a plurality of trenches is present, the trenches having a rectangular shape, i.e. as stripes. It has been found that a plurality of relatively narrow trenches is better for the morphology and other properties of the first and second active layers than one bigger trench. The trenches are preferably all running in parallel and aligned with the gate electrode.

The pattern of trenches may be continuous, particularly in one direction, such that the design of the transistor may be made independently of the manufacture and design of the semiconductor substrate structure. The pattern of trenches may alternatively be limited to active device regions. The stripes do not need to continue endlessly or to extend outside the active device regions, e.g. the pair of preferably interdigitated electrodes. It is even suitable to have areas without trenches, so as to optimize heat transfer to the substrate. If desired, the trenches may be filled with a suitable material, such as an oxide, a nitride or a combination thereof. The filling may be partial or full. In one embodiment, the trenches extend through the buried insulating layer. Extending the trenches through the buried insulating layer appears beneficial to reduce crack generation.

In a preferred embodiment, the pattern of the trenches is such that the drain region is electrically isolated from the source region. The drain region is herein defined as the region in the semiconductor substrate underlying the drain electrode. The source region is herein defined as the region in the semiconductor substrate underlying the source electrode. Though the terms source region and drain region typically refer to highly doped regions, this is not deemed necessary or advantageous in the present embodiment.

In the context of the present application, the semiconductor substrate is specifically a layer of semiconductor material. It typically includes an element from group IV of the periodic table. Examples of such materials include silicon, silicon carbide, silicon germanium, germanium. A preferred example of such semiconductor substrate is silicon that is provided in an orientation suitable for the growth of GaN, such as (001) or preferably (111). In case of silicon, it may be doped, undoped or treated to become highly resistive with a resistivity of over about $10^2$ Ω/cm, preferably about $10^4$ Ω/cm.

In a further implementation hereof, the electrically insulating layer below the semiconductor substrate is present on top of a handling wafer, i.e. it is preferably an SOI substrate. The insulating layer is suitably an oxide layer. Preferably, the oxide layer has a thickness in the range of about 10-5000 nm, preferably about 50-1000 nm and more preferably in the range of about 300-800 nm. This is a relatively thick oxide layer. It was observed that the breakdown voltage of the layer stack increases with increasing oxide thickness. With an about 500 nm $SiO_2$ buried layer, the breakdown voltage may be increased from about 1000 to 2000 V. However, a too large oxide layer may result in large stress.

The transistor is typically defined as a HEMT device. Various types of HEMT devices are known from literature, including a PHEMT, D-HEMT, a E-HEMT and DHFET. Good results have been obtained with a DHFET. The DHFET is known from K. Cheng et al., Phys. Stat. Sol. (c) 5 (2008), 1600, which is incorporate herein by reference.

Most suitably, the source and drain regions are shaped to constitute a pair of interdigitated fingers. Such layout considerably increases the channel width and is beneficial for power applications.

The device may comprise an array of source and drain electrodes, each the element within the array further comprising at least an active device region overlying at least one trench. It is suitably a power converter, and most suitably made in the substrate structure according to the invention.

DETAILED DESCRIPTION OF CERTAIN ILLUSTRATIVE EMBODIMENTS

Figure 1:
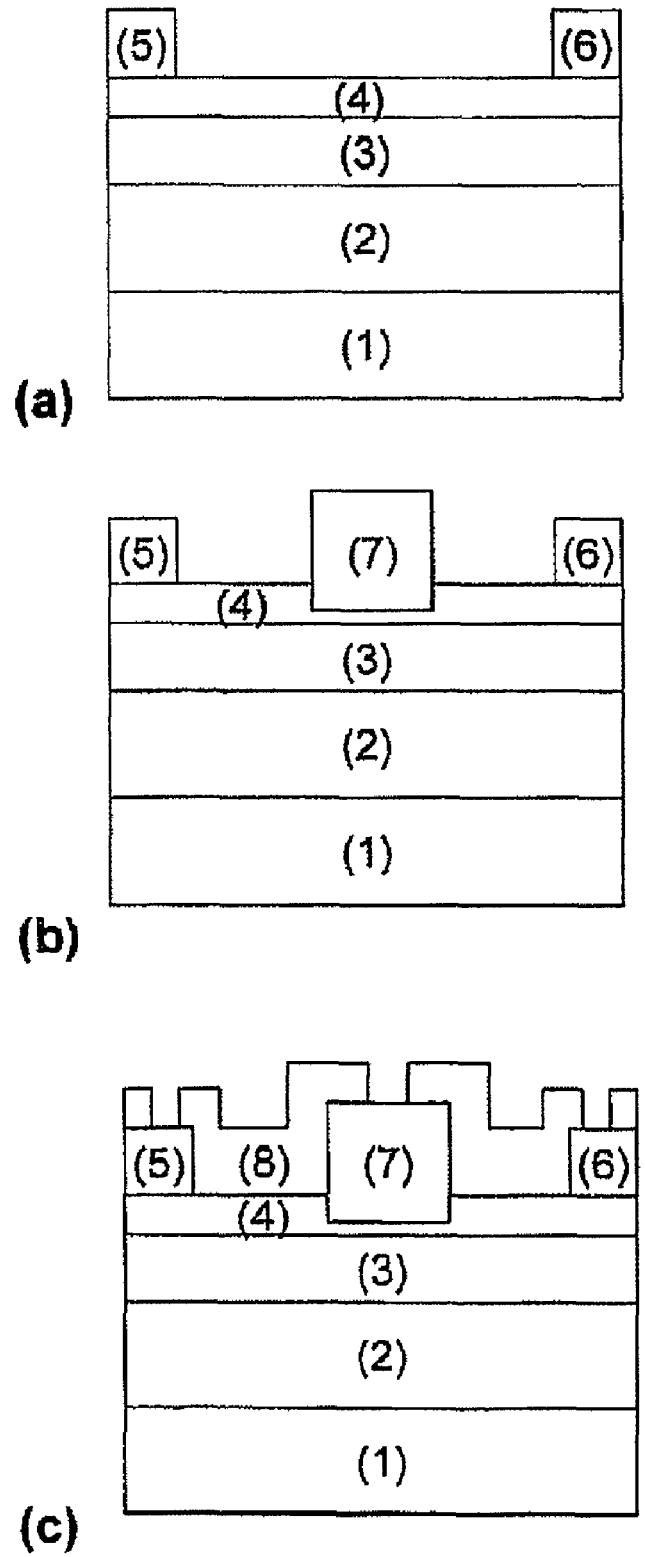
FIG. 1a-c is a schematic representation of the fabrication of a group Ill-nitride field effect device whereby the gate is fabricated prior to depositing the second passivation layer.

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the invention. Equal reference numbers in different figures refer to same or similar elements.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used herein are to be understood as being modified in all instances by the term "about." Accordingly, unless indicated to the contrary, the numerical parameters set forth herein are approximations that may vary depending upon the desired properties sought to be obtained. At the very least, each numerical parameter should be construed in light of the number of significant digits and ordinary rounding approaches.

The terms 'vertical', 'above', 'on top of', 'below', 'horizontal', 'lateral' are based on the orientation of a semiconductor substrate used for explanations and in engineering language, i.e. the top surface is the surface at which the transistors are defined and on which an interconnect structure is provided. The bottom surface is a surface opposite thereto. It is observed that these terms are thus relative to the main face of the semiconductor substrate extending laterally. There is no need that the orientation of the substrate or any device made therefrom is identical thereto.

When in the following materials or layers are mentioned without indication of the exact composition, for example SiN (also called silicon nitride or nitride) or SiO (also called silicon oxide), both the non-stoechiometric composition (SixNx or SixOy) and the stoechiometric composition (Si3N4 or SiO2) are included. The layers can also be a combination of regions with non-stoechiometric composition (SixNy or SixOy) and regions with stoechiometric composition (Si3N4 or SiO2). One embodiment relates to a method to fabricate group Ill-nitride field effect devices with improved characteristics. High Electron Mobility Transistors (HEMT's) are the best known example of group Ill-nitride field effect devices. The operation of group Ill-nitride field effect devices is based on the creation of a two-dimensional electron gas (2 DEG) at or near the interface between the two active layers. The 2 DEG acts as the channel of the transistor and is herein also referred to as the channel. In view of its lateral extension, the 2 DEG is also called a 2DEG layer. An active layer in group Ill-nitride field effect devices is a layer that contributes to the formation of the 2DEG. This can be for example because the layer is spontaneously or piezo-electrically polarized, or alternatively because the whole layer or part of the layer is highly doped and the free electrons diffuse into the 2DEG layer. The 2DEG layer, i.e. the channel of the transistor, is located in an active layer or at the interface between two active layers. An active layer is intrinsic to the transistor effect. The active layers will be called first active layer 2 and second active layer 3 (see FIGS. 1 and 2) in the following.

In general, the second active layer 3 has a higher band-gap when compared to the first active layer 2. Depending on the thickness, the composition and the loading effects on the surface of the second active layer 3, a two-dimensional electron gas (2 DEG) may appear at or near the interface between the two active layers 2,3. The thickness, the composition and the loading effects on the surface of the second active layer 3 can be chosen such that substantially a 2DEG is created at or near the interface between the two active layers 2,3. An example of active layers is a combination of GaN/AlGaN.

On top of the active layers 2,3 one or more passivation layers 4,8, for example SiN or SiO (non-stoechiometric SixNy or SixOy or stoechiometric Si3N4 or SiO2 or a combination of those layers) can be deposited. In silicon CMOS processing a passivation layer is used to avoid shift in V1, such that a better reliability can be obtained. In case of group Ill-nitride field effect devices, the passivation layer is used to avoid trapping and detrapping of charges in surface states, i.e. to avoid changes in the 2DEG density. So, the passivation layer 4 protects the transistor from external modifications. Therewith, the transistor characteristics are affected as little as possible by extrinsic parameters, such as modifications of electrical charges on the surface. A passivation layer 4 fixes or freezes the existing state of the surface of underlying (active) layers 2,3. Consequently the surface of the underlying (active) layers 2,3 is less sensitive to changes in the environment. Therewith, the properties of the underlying active layers 2,3 are less sensitive to changes in the environment.

Gate leakage current and dispersion are known problems of group III-nitride field effect devices. Surface states at the interfaces of the active layers 2,3, especially at the top surface of the second active layer 3 (for example AlGaN), and charges inside the dielectrics influence the dispersion. Surface states are influenced by the choice of materials, the deposition parameters of different layers, cleaning steps and surface treatments at different stages of the process flow. These treatments also have an influence on the reverse leakage current of the gate contact. To optimize the operation of group III-nitride field effect devices, much effort is done to optimize the interface between the second active layer 3 and the passivation layer 4, for example AlGaN—SiN interface. By carrying out cleaning steps on the first passivation layer 4, accumulation in time of oxide and/or contaminants on the surface of the passivation layer 4, and therewith changes in the 2 DEG layer, may be prevented.

When using the GaN for high power and high voltage applications, the breakdown voltage of the device is an important feature. Breakdown voltages of approximately 500 V have been made with HEMT devices grown with 4 μm AlGaN layers as the first active layer 2 and GaN as the second active layer 3. Several devices were prepared with different contact distances between the source contact and the drain contact. The breakdown voltage turned on to be linearly dependent on the contact distance up to a distance of about 5-8 microns. However, for any contact distance larger than about 8 microns, the breakdown voltage was not dependent on the contact distance. For HEMT devices grown with a thinner first active layer 2, the same behavior was observed, though with a lower breakdown voltage.

In one embodiment, modifications are made to the substrate in order to increase the breakdown voltage. Specifically, measures are taken so as to reduce or prevent generation of a conductive path through the substrate. The nitride layers, i.e. AlGaN, GaN layers or more general the first active layer and the second active layer 2,3, show a very high resistivity, for instance with a resistivity of more than about $0.5 \times 10^6$ $\Omega$.cm, more preferably of more than about $1 \times 10^6$ $\Omega$.cm or even of more than about $2 \times 10^6$ $\Omega$.cm. In comparison therewith, the underlying semiconductor substrate is relatively conductive. Its resistivity is typically less than about $10^4$ $\Omega$.cm, which is at most about 1% of the resistivity of the nitride layers. It was moreover found that a conductive path is formed in the semiconductor substrate. This conductive path was formed by diffusion of Al and Ga atoms into the underlying semiconductor layer, e.g. silicon. The diffused Al and Ga atoms will act as dopant atoms in the silicon lattice and thus enable transport of charge carriers.

Certain embodiments are specifically suitable for use in combination with a SOI-substrate comprising an buried insulating layer. It is however not limited thereto.

FIG. 1*a-c* shows a fabrication route for group Ill-nitride devices, such as field effect transistors and high electron mobility transistors (HEMT). These type of devices are typically made on a semiconductor substrate 1. A first active layer 2 and a second active layer 3 are deposited on top of the semiconductor substrate 1. An example of active layers 2,3 is a combination of GaN/AlGaN. A two-dimensional electron gas (2 DEG) may appear at or near the interface between the two active layers 2,3, if the second active layer 3 has a higher band-gap than the first active layer 2. Before the deposition of the GaN often a GaN nucleation layer is deposited. Also other functional layers can be added. The different layers can be grown by MOVPE or other methods known in the field. Subsequently, the stack is covered by a first passivation layer 4. This passivation layer 4 preferably comprises at least an electron donating element and nitrogen. It is for example is a SiN passivation layer or a thin in-situ SiN passivation layer 4. The SiN can be non-stoechiometric SixNy or stoechiometric $Si_3N_4$ or a combination of both stoechiometric $Si_3N_4$ and non-stoechiometric $Si_xN_y$. In the best case this SiN is stoechiometric $Si_3N_4$. The thickness of the passivation layer, for example SiN, can vary between about 1 nm and 5000 nm, even better between about 2 nm and 10 nm, even better between about 3 nm and 5 nm. This can be done by MOCVD according to EP1612866 (which is incorporated herein by reference) or by any other method known in the field.

The SiN layer can be deposited with metal organic chemical vapor deposition (MOCVD), for example. Preferably the SiN has a high quality, meaning a limited number of defects. Preferably, the SiN is deposited in-situ, and in the best case before cooling down the device. With 'in situ' is meant that the passivation layer is applied in the same deposition tool, in the best case before cooling down the device, for example by depositing the passivation layer in the same reaction chamber as the deposition of the first and second active layer.

In this structure, a mesa structure can be etched to isolate the single devices down to the GaN. A mesa structure is created by etching trenches between devices, thereby isolating active regions of individual devices. Mesa etching can also be done later in the processing, for examples after the formation of source, drain, and gate contacts. The complete GaN/AlGaN/SiN stack can be patterned or patterning can be done layer-by-layer. The layers can be patterned by standard lithography and micro-structuring techniques, as wet chemical etching, dry etching. The etching step can be performed in a reactive ion etch (RIE) system using chlorine chemistry. Instead of mesa etching an implementation, for instance of nitrogen or boron, can be done so as to limit the device laterally, i.e. the active device region. This has the advantage that the device remains a planar structure. The implantation is done with a suitable energy so as to ensure that the implanted species ends up in the first and second active layers and there destroys the channel.

Metallization of the Ohmic source 5 and drain 6 contacts with a subsequent high temperature annealing is done on top of the SiN passivation layer. Metallization can be done by Ti/Al/Mo/Au stack or other materials known in the field. The metallization is performed on top of the in-situ SiN overlapping the etched MESA structure.

Afterwards a gate can be made and additional cleaning steps and extra passivation layers can be deposited. In one embodiment, the gate contact 7 is made after the deposition of the first passivation layer 4, source and drain contacts 5,6, but before the deposition of the second passivation layer 8. In another embodiment the gate contact 7 is made after the deposition of the second passivation layer 8, by definition of a gate trench into the second passivation layer and filling the trench with one or more materials, such as a barrier layer and a conductive material. The barrier layer herein also acts as a Schottky barrier to the 2-DEG layer. A suitable material for the barrier layer is TaN, TiN, TiWN, Ti, Ta, WSiN. This embodiment is further shown in WO2009/012536 which is incorporated herein by reference.

The second passivation layer 8 is suitably deposited to protect the underlying layers, for example from oxidation. This second passivation layer can be $SiO_2$ (silicon oxide), SiN (silicon nitride), $Al_2O_3$ (aluminum oxide), $HfO_2$ (hafnium oxide), or $Ta_2O_5$ (tantalum oxide) or can contain any of $SiO_2$, SiN, $Al_2O_3$, $HfO_2$, or $Ta_2O_5$, or can be a combination of several layers containing any of $SiO_2$, SiN, SiC, SiON, SiCN, $Al_2O_3$, $HfO_2$, or $Ta_2O_5$. In fact any other material that can be used as a passivation layer can be included in this second passivation layer. Preferably, sputtered $SiO_2$ is used or $SiO_2$ or SiN deposited with Plasma Enhanced Chemical Vapor Deposition (PECVD) is used. The thickness of this second passivation layer 8 can be in between about 5 nm and 10 μm, in between about 10 nm and 5 μm, between about 100 nm and 400 nm, or between about 150 m and 250 nm. This second passivation layer 8 can cover the whole structure. In that case holes can be provided for contacting source, drain and gate. Etching of these holes can be done with standard lithography and etching or other methods know in the art. This may be a final passivation layer or other layers can be added. Suitably, the second passivation layer 8 is deposited immediately after cleaning the first passivation layer 4. This prevents re-oxidation of the first passivation layer 4, for example in-situ SiN, and prevents the adsorption of other contaminants on the first passivation layer 4.

Figure 2:
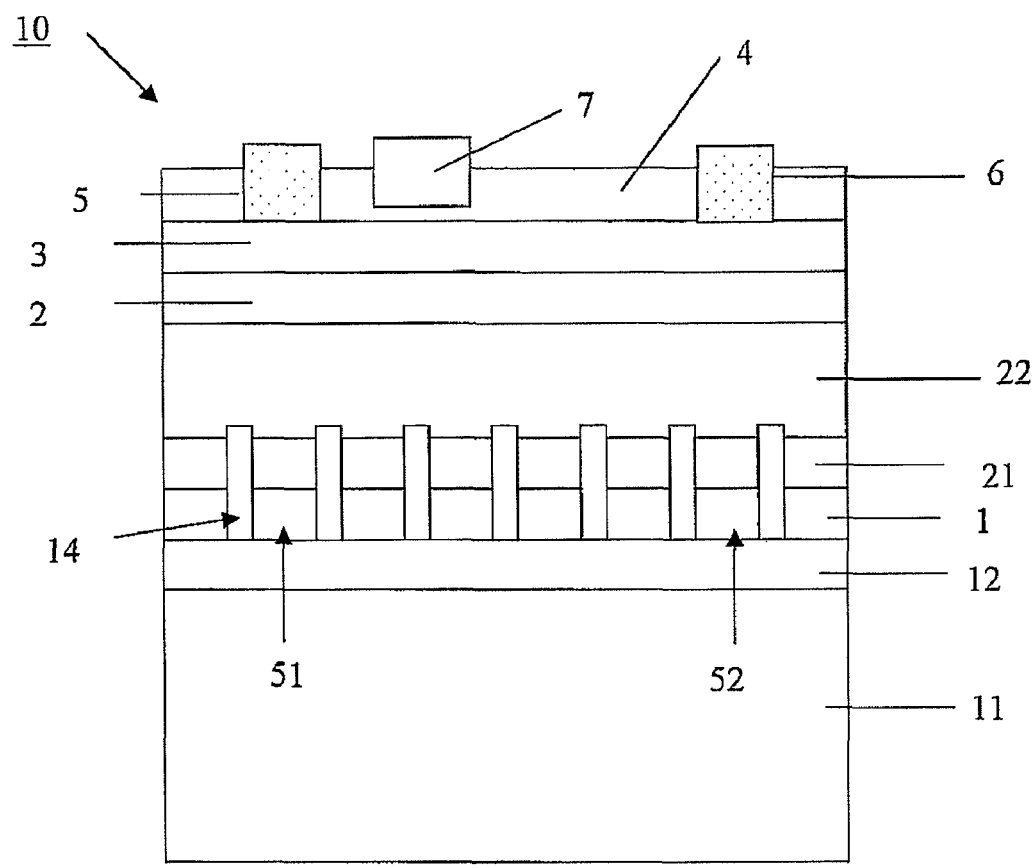
FIG. 2 is a diagrammatical cross-sectional view of a first embodiment of the device.

FIG. 2 shows the device 10 according to a first embodiment. In this embodiment, the device comprises a SOI type substrate comprising a handling wafer 11, a buried insulating layer 12 and the semiconductor substrate 1, also known as device layer. Trenches 14 have been applied extending through the semiconductor substrate 1. In a specific, most suitable embodiment, the trenches are designed in such a pattern as to create a source island 51 and a drain island 52. This patterning into source and drain islands 51, 52 and the presence of the buried insulating layer 12 result in a full electrical isolation of the source from the drain. In the example shown in FIG. 2, the semiconductor substrate 1 is subdivided into a plurality of islands. Some of these islands may be connected—out side the plane shown in this FIG. 2—to the source island 51, others may be connected to the drain island 52. It will be further understood that the number and shape of segments constitute design choices.

The first active layer 2 is present on top of a buffer structure comprising a first layer 21 and a second layer 22. This buffer structure is present on top of the semiconductor substrate 1. In this embodiment, the trenches 14 extend into the first layer 21 of the buffer structure. That typically results from the manufacturing process, but is not required for the improved functionality of the device according to one embodiment. In other words, the first layer 21 of the buffer structure may be absent; in that case the second layer 22 in which overgrowth of the trenches occurs, forms the buffer structure. The first layer 21 may further act as a nucleation layer. In that case, it will have a limited thickness as known to the skilled person. The first layer 21 and second layer 22 may contain the same elements, wherein the mutual ratio differs. Both layers are for instance AlGaN, with the second layer 22 being Ga-rich and the first layer 21 being Al-rich. While the trenches 14 are shown to be block-shaped in the cross-section shown in FIG. 2, this shape is merely diagrammatical. In fact, a semi-circular top side of the trench 14 is probably more realistic, in view of the formation by overgrowth.

The GaN-type layer stack comprises herein the first active layer 2 and the second active layer 3. Suitably, the first active layer 2 comprises GaN, and the second active layer 3 comprises AlGaN. However, additional layers may be present in the layer stack. The device shown in FIG. 2 further comprises a source electrode 5, a drain electrode 6 and a gate electrode 7. The gate electrode 7 is aligned with the trenches 14, so as to create minimum overlap, hence minimum parasitic capacitance, between the gate electrode 7 and any of the source and drain regions in the first and second active layers 2,3. In line with the patterning of the source and drain islands 51, 52, the segments of the source electrode 5 and the segments of the gate electrode 7 are mutually connected outside the plane of the Figure. Preferably, a plurality of trenches 14 is present.

In a suitable embodiment, the insulating layer 12, particularly a buried insulating layer, such as an oxide, has a thickness in the range of about 100 to 1200 nm. Preferably, the thickness is at least about 300 nm, and preferably between about 400 and 1200 nm. An increase in breakdown voltages of over about 1000V can be obtained with the patterned semiconductor substrate 13 of one embodiment and an increased thickness of the buried oxide layer 12. The breakdown voltage is herein defined as the voltage at which the leakage current is about 1 mA/mm of channel. The breakdown voltage is measured with test structures, in which the source and gate are at fixed lateral distance, particularly about 2 microns. The lateral distance between the gate and the drain is varied.

The handling wafer 11 of the substrate can be chosen from any of the materials as mentioned above, including SiC, Si, AlN, sapphire, or any other material that can be used as a substrate for the deposition of group III-nitrides and the fabrication of group III-nitride devices. Alternative materials such as glass are not excluded, even though they have the disadvantage of not meeting processing requirement of semiconductor wafer fabs. Si may be provided as amorphous, polycrystalline or monocrystalline silicon.

The semiconductor substrate is chosen so as to optimize growth of the group III-N layers. Good results have been obtained with Si(111), Si(001), SiC, and Si(111) appears most preferable. The semiconductor substrate typically has a thickness in the order of about 10-200 nm.

FIG. 3*a-d* shows in a schematic cross-sectional view a first embodiment of the method. For reasons of simplicity, the provision of the passivation layers 4, 8 as well as the source, drain and gate electrodes 5, 6 and 7 has not been shown.

Figure 3A:
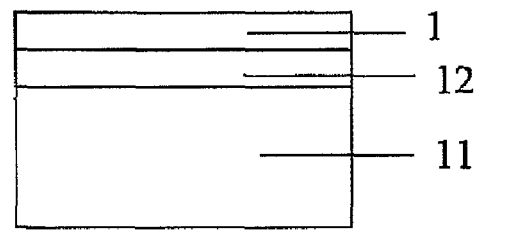
FIG. 3a-d shows several steps of the method of manufacturing the device according to a first embodiment of the invention.

In a first step as shown in FIG. 3*a*, an SOI substrate is provided comprising a handling wafer 11, a buried insulating layer 12, typically silicon oxide, and the semiconductor substrate 1—also referred to as a device layer.

Figure 3B:
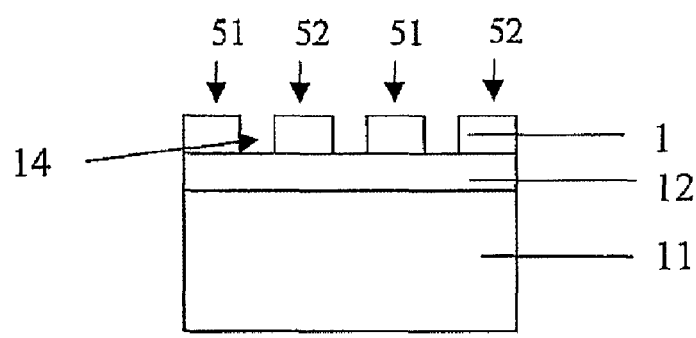

As shown in FIG. 3*b*, the semiconductor substrate 1 of the SOI substrate is thereafter patterned so as to create source islands 51 and drain islands 52. The patterning is suitably carried out by etching in a manner known to the skilled person. Even though the regularity of the shapes suggests the use of anisotropic etching, wet etching is not excluded. The buried insulating layer 12 suitably acts as an etch stop layer.

However, the buried insulating layer 12 may be patterned also, so as to extend the trenches 14 into the buried insulating layer 12. It is not excluded that the trenches 14 even extend through the buried insulating layer 12.

Figure 3C:
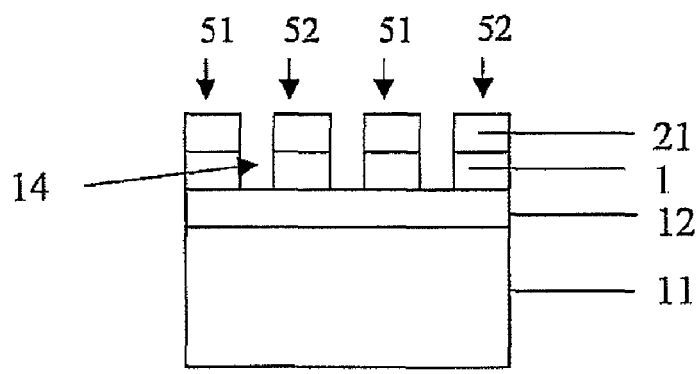

FIG. 3c shows a further step of the manufacture, wherein a first layer 21 of the layer stack 20 is grown onto the source islands 51 and the drain islands 52. This first layer 21 will be provided selectively on the islands 51, 52 only. As a result, the trench 14 also extends into and through this first layer 21. Before or after this step, the trenches 14 may be filled with one or more suitable materials. Most preferably, at least one of these materials is an insulating material. Typical examples include nitrides and oxides.

Figure 3D:
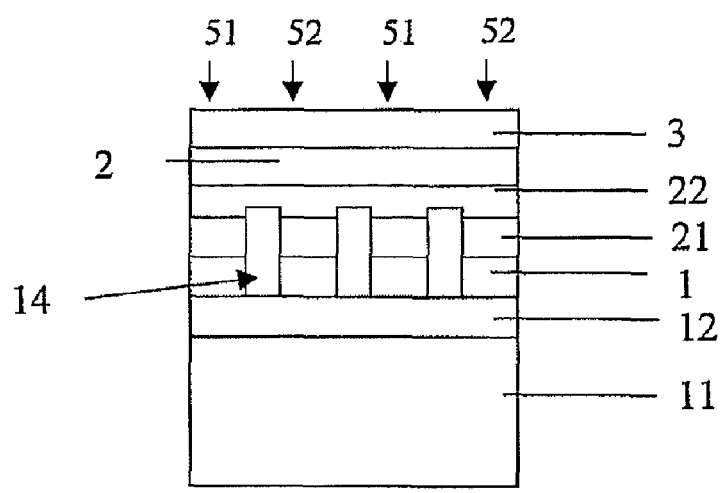

FIG. 3d shows another step of the manufacture, wherein a second layer 22 is grown onto the first layer 21. This second layer 22 is grown in a manner so as to obtain overgrowth, particularly by growing at high temperature and low pressure, such as a temperature in the range of about 900-1500° C. and a pressure below about 0.4 bar ($4.10^4$ Pa). The first layer 21 and the second layer 22 together constitute a buffer. On top of those the first active layer 2 and the second active layer 3 are grown. Further layers are provided on top of those, such as a passivation layer and the like, as shown in previous Figures.

In a further embodiment (not shown) the first layer 21 of the buffer structure is deposited on the semiconductor substrate 1 prior to patterning. The patterning then occurs to make the trenches 14 extending through both the first layer 21 and the semiconductor substrate 1. Most suitably, use is made of etching, particularly dry etching such as RIE etching for this patterning. The etching may occurs in two steps with two different etchants. However, it is not excluded to use other techniques for patterning, including laser etching, and the like.

Figure 4:
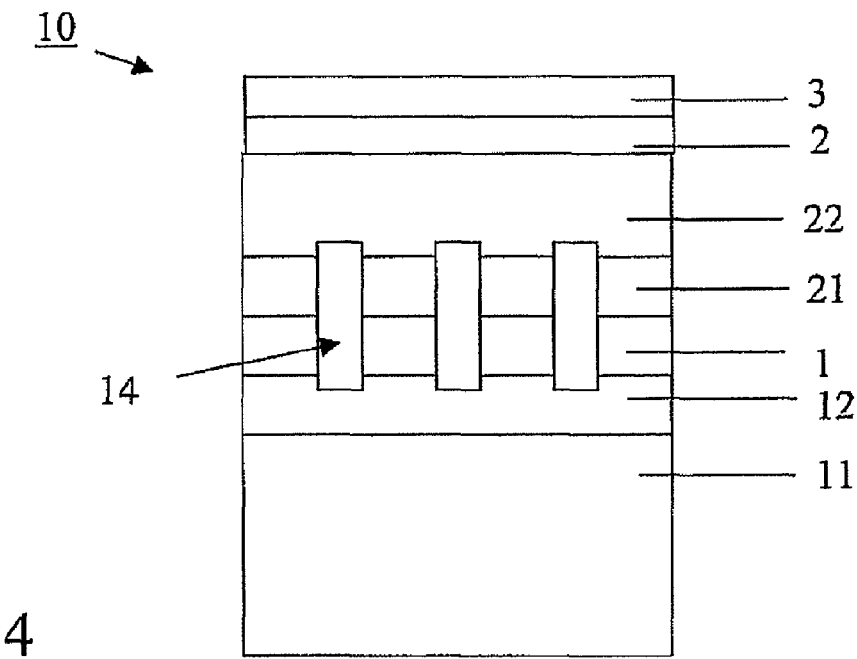
FIGS. 4, 5 and 6 show in diagrammatical cross-sectional views further embodiments of the invention.
Figure 5:
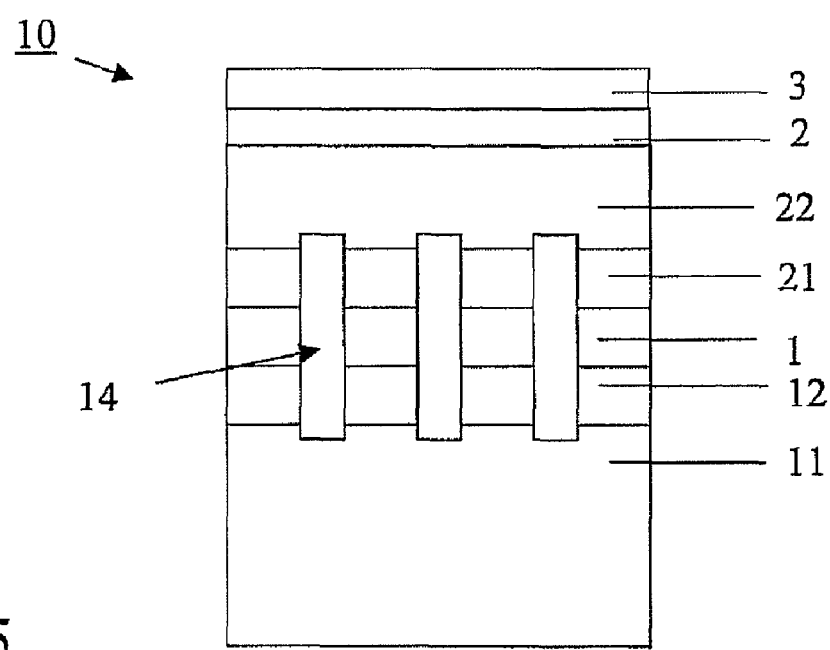
Figure 6:
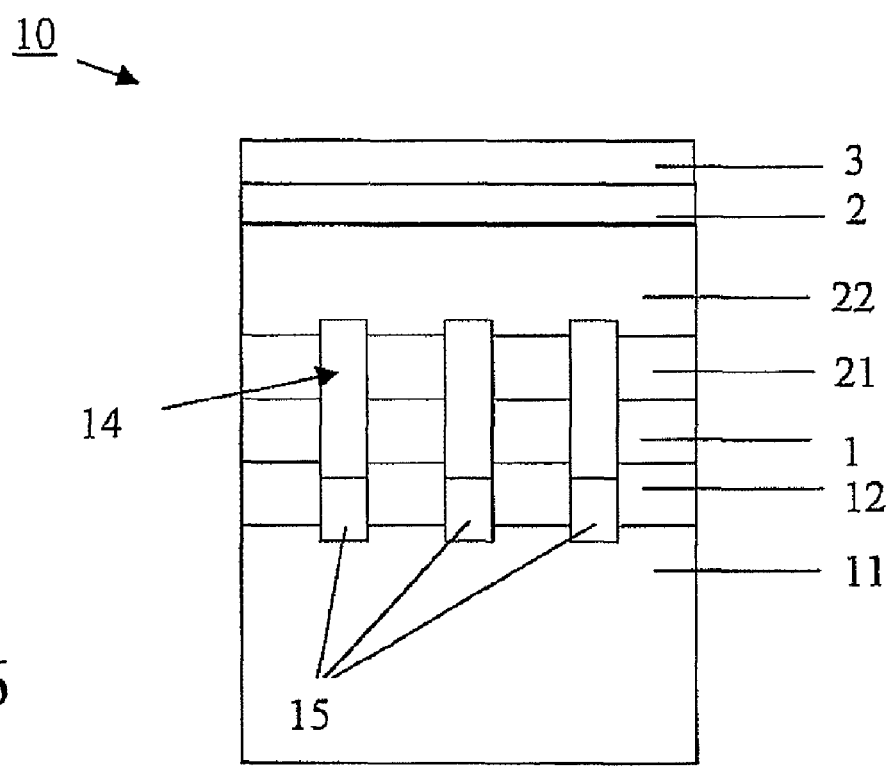

FIGS. 4, 5 and 6 show in diagrammatical cross-sectional views further embodiments of the invention. The views and reference numerals in the FIGS. 4, 5 and 6 correspond to the one in FIG. 3d. For that reason, the discussion will be limited to the relevant differences. FIG. 4 shows the option of etching into the buried insulating layer 12. This has the advantage of removing any traces of the semiconductor substrate 1 that may have been maintained. FIG. 5 shows the option of etching through the buried insulating layer 12 into the handling wafer 11. Suitably, in this case, one provides the first layer 21 of the buffer structure prior to the patterning. FIG. 6 shows a result when the first layer 21 is grown after the etching through the buried insulating layer 12 into the handling wafer 11. Now, the semiconductor material of the handling wafer 11 is no longer covered with an insulating layer. Therefore, growth of GaN and/or MN and/or GaAlN not only occurs on top of the semiconductor substrate 1, but also on top of the handling wafer 11. This leads to residues 15. Preferably, those residues do not extend above the buried insulating layer 12. Typically, the handling wafer 11 has another orientation than the semiconductor substrate 1. Then the growth the of residues will occur in another, less preferred orientation. The growth of the residues 15 may be prevented by using a less common material for the handling wafer than the standard silicon, particularly an insulating material. However, the residues typically do not harm, hence there is no reason to exclude other materials.

Figure 7A:
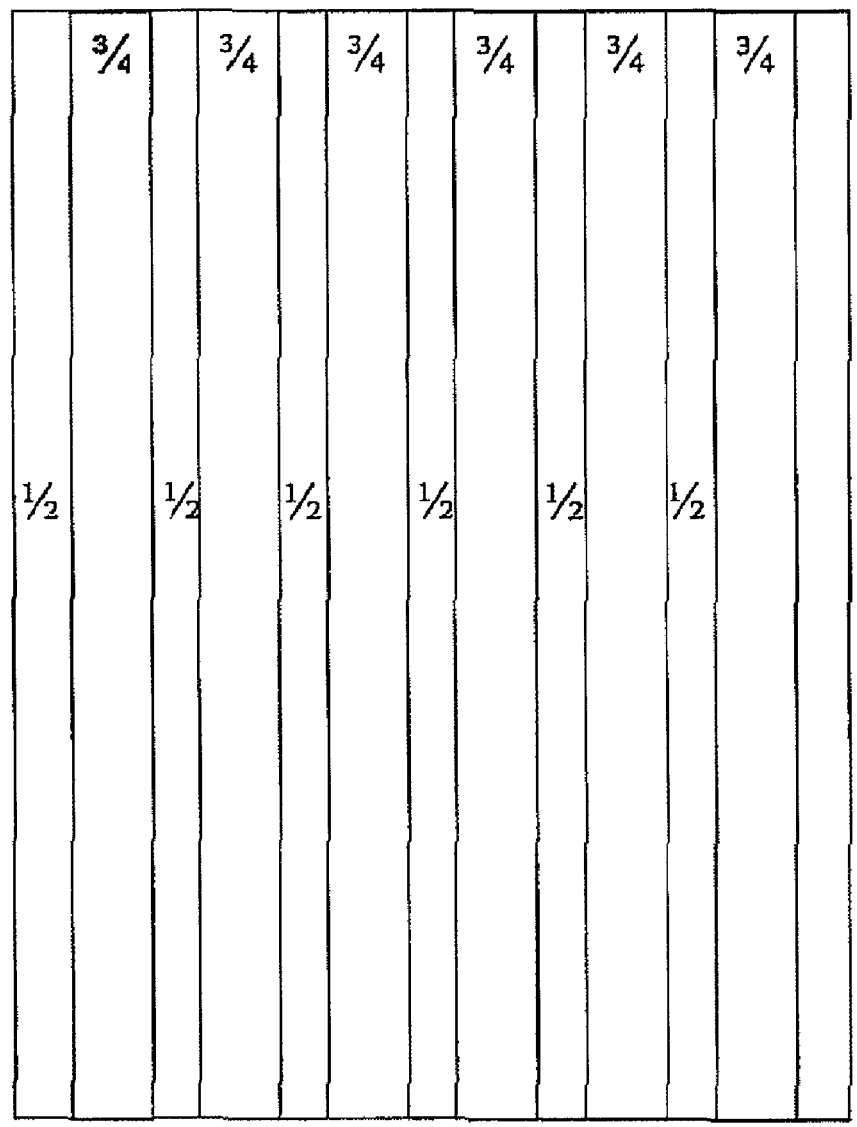
FIG. 7a-d shows diagrammatical top views of the substrate structure according to one embodiment showing different patterns defined into the semiconductor substrate.
Figure 7B:
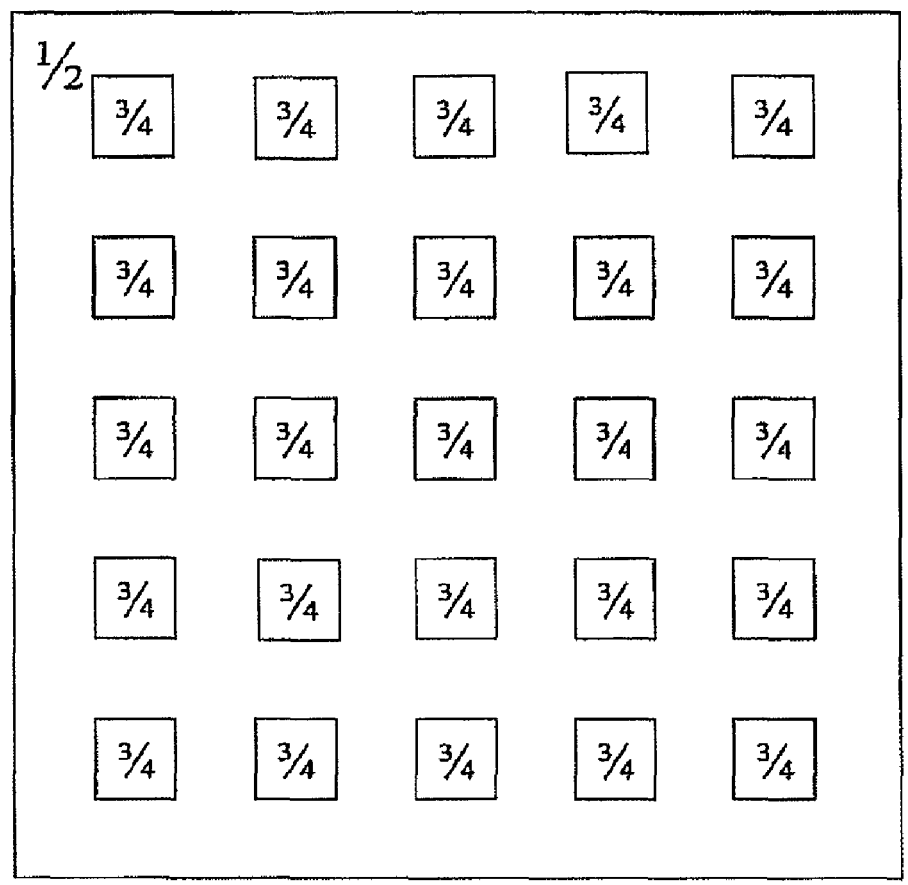
Figure 7C:
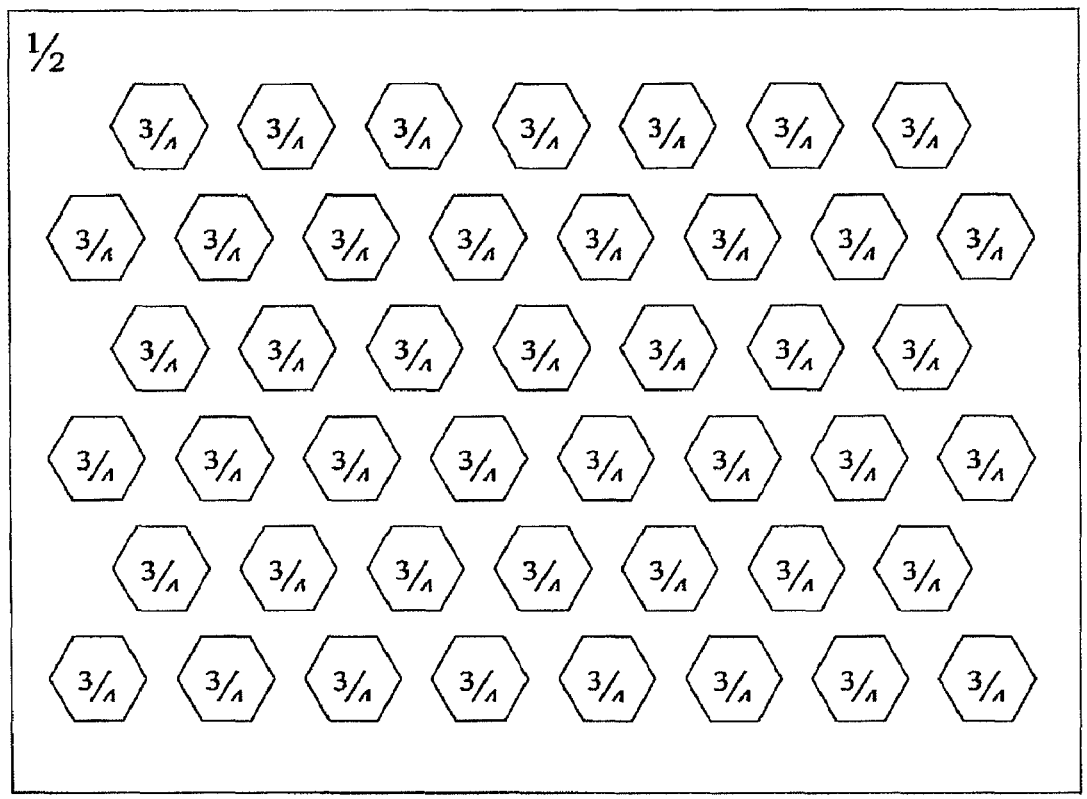
Figure 7D:
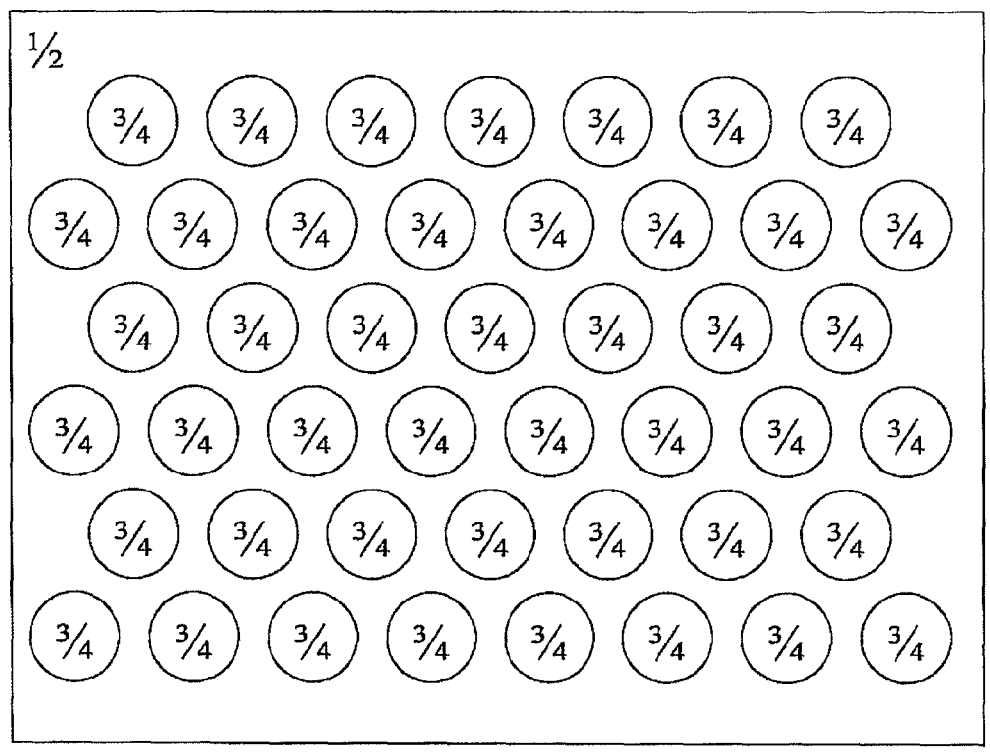

FIG. 7a-d shows diagrammatical top views of the substrate structure according to one embodiment showing different patterns defined into the semiconductor substrate 1. Herein, the reference ¾ refers to the islands and ½ refers to the trenches. In FIG. 7a, the semiconductor substrate 1 is patterned into stripes. In FIG. 7b, the semiconductor substrate is patterned into square-shaped islands. In FIG. 7c, the semiconductor substrate is patterned into hexagonal islands. In FIG. 7d, the semiconductor substrate is patterned into circular islands. It will be recognized that these patterns can be provided throughout a substrate. Hence, a substrate manufacturer may define the patterns without getting specific information on the design of the semiconductor circuit of a customer. It therewith matches the typical organization in semiconductor industry. Furthermore, different patterns may be combined, and both the width or diameter of the patterns as well as the pitch may be varied and chosen so as to get the best result. Typically, the patterns are smaller than a single transistor, so as to ensure isolation of the drain island from the source island. Most suitably, as shown in previous figures, there are several patterns per transistor, for instance 3-1000, preferably 5-300, more preferably, 10-50, or also 3-10 for submicronscale transistors.

One embodiment relates to a semiconductor device comprising a semiconductor substrate and a GaN-type layer stack on top of a semiconductor substrate, which GaN-type layer stack comprises at least one buffer layer, a first active layer and a second active layer, at an interface of which first and second active layer active device regions are defined to constitute a channel, a gate electrode being present for influencing a charge distribution in the channel, a source electrode and a drain electrode being in contact with at least one of the active layers, wherein the semiconductor substrate comprises a first region and a second region that are mutually electrically insulated, and which first and second region substantially overlap, respectively, with a perpendicular projection of the source and drain electrodes on the semiconductor substrate.

In one embodiment, the electrical insulation is achieved by patterning the semiconductor substrate so as that the first region is a source island and the second region is a drain island. However, an alternative electrical insulation method, such as by amorphization or patterned oxidation of the semiconductor substrate is not excluded. More preferably, the semiconductor substrate is a layer of a thickness of less than about 100 micron, preferably less than about 10 micron and more preferably about 2 microns or less that is present on top of an electrically insulating layer.

One embodiment relates to a semiconductor substrate structure in which the semiconductor device can be defined. Such substrate structure thereto comprises a semiconductor substrate and a GaN-type layer stack on top of a semiconductor substrate, which GaN-type layer stack comprises at least one buffer layer, a first active layer and a second active layer, at an interface of which first and second active layer active device regions are definable to constitute a channel extending between a source electrode and a drain electrode, wherein the semiconductor substrate comprises a first region and a second region that are mutually electrically insulated, and which first and second region substantially overlap, respectively, with a perpendicular projection of the source and drain electrodes on the semiconductor substrate.

Specifically, the first region and the second region are present on an insulating layer and is patterned to define trenches according to a predefined pattern, which pattern comprises at least one trench underlying such active device region, the trenches extending from the insulating layer into at least one buffer layer of the GaN-type layer stack and being overgrown within the at least one buffer layer, so as to obtain that the first and the second active layer are continuous at least within the active device regions.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A semiconductor substrate structure comprising:
a semiconductor substrate and a GaN-type layer stack on top of the semiconductor substrate, the GaN-type layer stack comprising at least one buffer layer, a first active layer, and a second active layer, wherein active device regions are definable at an interface of the first and second active layer,
wherein the semiconductor substrate is present on an insulating layer and is patterned to define trenches according to a predefined pattern, the pattern comprising at least one trench underlying the active device regions, the trench extending from the insulating layer into at least one buffer layer of the GaN-type layer stack and being overgrown within the at least one buffer layer, so as to obtain that the first and the second active layer are continuous at least within the active device regions.

2. The semiconductor substrate structure according to claim 1, wherein the at least one buffer layer comprises a ternary or more complex composition comprising gallium, nitride, and a further group-III element, wherein the at least one buffer layer comprises a first sublayer and a second sublayer on top of the first sublayer, the second sublayer having a Ga-content that is higher than the Ga-content of the first sublayer, wherein the trench is overgrown in the second sublayer.

3. The semiconductor substrate structure according to claim 2, wherein the second sublayer is Ga-rich in that the Ga-content is more than about 50% relative to the further group-III element.

4. The semiconductor substrate structure according to claim 1, wherein the trenches extend into the insulating layer or beyond.

5. The semiconductor substrate structure according to claim 4, wherein the insulating layer is a buried insulating layer present between a handling wafer and the semiconductor substrate, and the trenches extend through the buried insulating layer, therewith exposing the handling wafer.

6. The semiconductor substrate structure according to claim 1, wherein the pattern of trenches comprises a series of parallel rectangular stripes underlying the active device regions.

7. The semiconductor substrate structure according to claim 1, wherein the at least one buffer layer comprises a surface with the trench, the surface comprising an angle relative to a top surface of the semiconductor substrate, the angle being smaller than about 45 degrees.

8. The semiconductor substrate structure according to claim 1, wherein the at least one buffer layer comprises a surface with the trench, the surface comprising an angle relative to a top surface of the semiconductor substrate, the angle being between about 10 and 40 degrees.

9. A semiconductor device comprising:
a semiconductor substrate and a GaN-type layer stack on top of the semiconductor substrate, the GaN-type layer stack comprising at least one buffer layer, a first active layer, and a second active layer, wherein an active device region is defined at an interface of the first and second active layer, the active device region acting as a channel between a source and a drain electrode, a gate electrode being present for influencing a charge carrier distribution in the active device region,
wherein the semiconductor substrate is present on an insulating layer and is patterned to define trenches according to a predefined pattern, the pattern comprising at least one trench underlying the active device region, the trenches extending from the insulating layer into at least one buffer layer of the GaN-type layer stack and being overgrown within the at least one buffer layer, so as to obtain that the first and the second active layer are continuous at least within the active device regions.

10. The semiconductor device according to claim 9, wherein the pattern of trenches comprises a series of parallel rectangular stripes underlying such active device region, the stripes being at least substantially aligned with the gate electrode.

11. The semiconductor device according to claim 9, wherein the source and drain electrode are defined in a shape of a pair of interdigitated fingers, the gate electrode having fingers extending in parallel to the fingers of the source and the drain electrode, the at least one trench being defined relative to the electrodes so as to underlie the active device region between the gate and the drain electrodes.

12. The semiconductor device according to claim 9, wherein the semiconductor substrate comprises a first and a second region, the first and second region substantially overlapping with a perpendicular projection on the semiconductor substrate of the source and the drain electrode respectively, the first and second region being mutually electrically insulated.

13. The semiconductor device according to claim 9, wherein the at least one buffer layer comprises a ternary or more complex composition comprising gallium, nitride, and a further group-III element, wherein the at least one buffer layer comprises a first sublayer and a second sublayer on top of the first sublayer, the second sublayer having a Ga-content that is higher than the Ga-content of the first sublayer, wherein the trench is overgrown in the second sublayer.

14. The semiconductor device according to claim 9, wherein the trenches extend into the insulating layer or beyond.

15. The semiconductor device according to claim 14, wherein the insulating layer is a buried insulating layer present between a handling wafer and the semiconductor substrate, and the trenches extend through the buried insulating layer, therewith exposing the handling wafer.

16. The semiconductor device according to claim 9, wherein the at least one buffer layer comprises a surface with the trench, the surface comprising an angle relative to a top surface of the semiconductor substrate, the angle being between about 10 and 40 degrees.

* * * * *